(12) United States Patent
Ginley et al.

(10) Patent No.: US 8,759,144 B2
(45) Date of Patent: Jun. 24, 2014

(54) FABRICATION OF CONTACTS FOR SILICON SOLAR CELLS INCLUDING PRINTING BURN THROUGH LAYERS

(75) Inventors: David S. Ginley, Evergreen, CO (US);
Tatiana Kaydanova, Montreal (CA);
Alexander Miedaner, Boulder, CO (US); Calvin J. Curtis, Lakewood, CO (US); Marinus Franciscus Antonius Maria van Hest, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 556 days.

(21) Appl. No.: 12/745,400

(22) PCT Filed: Nov. 3, 2008

(86) PCT No.: PCT/US2008/082261
§ 371 (c)(1),
(2), (4) Date: May 28, 2010

(87) PCT Pub. No.: WO2009/059302
PCT Pub. Date: May 7, 2009

(65) Prior Publication Data
US 2010/0300522 A1    Dec. 2, 2010

Related U.S. Application Data

(60) Provisional application No. 60/984,903, filed on Nov. 2, 2007.

(51) Int. Cl.
*H01L 21/00* (2006.01)
(52) U.S. Cl.
USPC ............................................. 438/98; 136/256
(58) Field of Classification Search
CPC ............... H01L 31/022425; H01L 31/022433; Y02E 10/50
USPC ................................ 438/98, 72, 608; 136/256
See application file for complete search history.

(56) References Cited

U.S. PATENT DOCUMENTS

| 5,711,803 A | 1/1998 | Pehnt et al. |
| 6,126,740 A | 10/2000 | Schulz et al. |

(Continued)

FOREIGN PATENT DOCUMENTS

| WO | 2007001468 | 1/2007 |
| WO | 2009059302 | 5/2009 |

OTHER PUBLICATIONS

Schubert et al., "Current Transport Mechanism in Printed AG Thick Film Contact to an N-Type Emitter of a Crystalline Silicon Solar Cell," 19th European Solar Energy Conference and Exhibition, Jun. 7-11, 2004, Paris, France.

(Continued)

*Primary Examiner* — Shaun Campbell
(74) *Attorney, Agent, or Firm* — John C. Stolpa

(57) ABSTRACT

A method for fabricating a contact (240) for a solar cell (200). The method includes providing a solar cell substrate (210) with a surface that is covered or includes an antireflective coating (220). For example, the substrate (210) may be positioned adjacent or proximate to an outlet of an inkjet printer (712) or other deposition device. The method continues with forming a burn through layer (230) on the coating (220) by depositing a metal oxide precursor (e.g., using an inkjet or other non-contact printing method to print or apply a volume of liquid or solution containing the precursor). The method includes forming a contact layer (240) comprising silver over or on the burn through layer (230), and then annealing is performed to electrically connect the contact layer (240) to the surface of the solar cell substrate (210) through a portion of the burn through layer (230) and the coating (220).

12 Claims, 5 Drawing Sheets

(56) References Cited

U.S. PATENT DOCUMENTS

| | | | |
|---|---|---|---|
| 6,436,305 | B1 | 8/2002 | Schulz et al. |
| 6,830,778 | B1 | 12/2004 | Schulz et al. |
| 6,951,666 | B2 | 10/2005 | Kodas et al. |
| 7,014,979 | B2 | 3/2006 | Byun et al. |
| 8,093,491 | B2 * | 1/2012 | Sridharan et al. .............. 136/256 |
| 2005/0078158 | A1 | 4/2005 | Magdassi et al. |
| 2005/0277274 | A1 | 12/2005 | Karkkainen |
| 2006/0001726 | A1 | 1/2006 | Kodas et al. |
| 2006/0043346 | A1 | 3/2006 | Kodas et al. |
| 2006/0060757 | A1 | 3/2006 | Takiba et al. |
| 2006/0208257 | A1 | 9/2006 | Branz et al. |
| 2006/0231804 | A1 | 10/2006 | Wang et al. |
| 2007/0163634 | A1 | 7/2007 | Wada et al. |
| 2008/0003364 | A1 | 1/2008 | Ginley et al. |
| 2010/0163810 | A1 | 7/2010 | Ginley et al. |
| 2010/0209594 | A1 | 8/2010 | Curtis et al. |
| 2013/0011957 | A1 | 1/2013 | Ginley et al. |

OTHER PUBLICATIONS

Rivkin et al., "Direct Write Processing for Photovoltaic Cells," 12th Workshop on Crystalline Silicon Solar Cell Materials and Processes, Aug. 2002, National Renewable Energy Laboratory/BK-520-32717, pp. 223-226.

Hoornstra et al., "Lead Freee Metallisation paste for Crystalline Silicon Solar Cells: From Model to Results," Conference Record of the Thirty-first IEEE Photovoltaic Specialists Conference, Orlando, FL, Jan. 3-7, 2005, pp. 1293-1296.

Ballif et al., "Silver thick-film contacts on highly doped n-type silicon emitters: Structural and electronic properties of the interface," Applied Physics Letters, vol. 82, Issue 12, pp. 1878-1880 (2003).

Sridharan et al., "Lead Free Silver Front Contact Pastes for SiNx Coated Polycrystalline Silicon Solar Cells," International PVSEC-15, Shanghai, China (2005) pp. 1-2.

International Search Report & Written Opinion dated Jan. 6, 2009, for International Application PCT/US08/82261.

Calvert, "Inkjet Printing Materials and Devices," Chem. Matter, 2001, vol. 13, pp. 3299-3305, American Chemical Society.

Curtis, "Metallizations by Direct-Write Inkjet Printing," 2001, NREL/CP-520-31020, pp. 1-4, National Renewable Energy Laboratory, Golden, Colorado.

Di Risio, et al., "Piezoelectric Ink-Jet Printing of Horseradish Peroxidase Effect of Ink Viscosity Modifiers on Activity," Macromolecular Rapid Communications, 2007, vol. 28, pp. 1934-1940, Wiley-VCH CmbH & Co. KGaA,Weinheim.

Hoornstra, et al., "Lead free metallisation for silicon solar cells: results from the EC2Contact project," 20th European Photovoltaic Solar Energy Conference, Jun. 6-10, 2005, Barcelona, Spain.

Yancey, "Direct Write Metallizations with Organometallic Inks," Aug. 18, 2000, DOE Energy Research Undergraduate Laboratory Fellowship, pp. 1-19, National Renewable Energy Laboratory, Golden, Colorado.

Jang, et al., "Influence of Fluid Physical Properties on Ink-Jet Printability," Langmuir, 2009, vol. 25, pp. 2629-2635, American Chemical Society.

Kang, "Water-Based Ink-Jet Ink, I. Formulation," Journal of Imaging Science, May/Jun. 1991, vol. 35, No. 3, pp. 179-188, IS&T—The Society for Imaging Science and Technology.

Kang, "Water-Based Ink-Jet Ink, II. Characterization," Journal of Imaging Science, May/Jun. 1991, vol. 35, No. 3, pp. 189-194, IS&T—The Society for Imaging Science and Technology.

Kang, "Water-Based Ink-Jet Ink, III. Performance Studies," Journal of Imaging Science, May/Jun. 1991, vol. 35, No. 3, pp. 195-201, IS&T—The Society for Imaging Science and Technology.

Kaydanova, et al., "Direct Write Contacts for Solar Cells," Conference Paper, Feb. 2005, NREL/CP-520-37524, pp. 1-5, National Renewable Energy Laboratory, Golden, Colorado.

Kaydanova, et al., "Ink Jet Printing Approaches to Solar Cell Contacts," PV and Solar Program Review Meeting, Mar. 2003, NREL/CD-520-33594, pp. 1-4, National Renewable Energy Laboratory, Golden, Colorado.

Ginley, et al., "Inkjet Direct Write Solar Cells," Dec. 7, 2005, Contract No. RD-93, Report No. 1, National Renewable Energy Laboratory, Golden, CO.

Ginley, et al., "Inkjet Direct Write Solar Cells," Feb. 6, 2006, Contract No. RD-93, Report No. 3, National Renewable Energy Laboratory, Golden, CO.

Jiang, X., et al., "Ethylene glycol-mediated synthesis of metal oxide nanowires," J. Mater. Chem. 2004, 14, 695-703.

USPTO non-final office action, dated Oct. 7, 2011, for NREL 03-03A, U.S. Appl. No. 12/719,285.

USPTO final rejection, dated Nov. 28, 2008, for NREL 03-03, U.S. Appl. No. 11/427,270.

USPTO non-final office action, dated Jun. 13, 2008, for NREL 03-03, U.S. Appl. No. 11/427,270.

USPTO non-final office action, dated Jun. 23, 2009, for NREL 03-03, U.S. Appl. No. 11/427,270.

* cited by examiner

FABRICATION OF CONTACTS FOR SILICON SOLAR CELLS INCLUDING PRINTING BURN THROUGH LAYERS

CROSS-REFERENCE TO RELATED APPLICATIONS

This application claims the benefit of U.S. Provisional Application No. 60/984,903, filed Nov. 2, 2007, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

With the growing interest in renewable energy, including the use of solar power, there is an increasing demand for more efficient solar cells. Solar cells or photovoltaic (PV) cells are devices that convert solar energy into electricity by the photovoltaic effect, and solar cells are widely used in devices ranging from satellites and other applications including portable consumer electronic devices that are remote from a conventional power source. More recently, large solar power collection systems with arrays of cells or PV modules are being used to supply power to electrical grids for distribution to consumers. Several concerns are limiting the implementation of solar cells, including cost of materials and manufacturing, environmental concerns with materials such as lead, and low efficiency of the cells. As a result, researchers continue to look for ways to lower manufacturing costs and designs that use more environmentally friendly materials. Further, existing solar cells such as those based on a silicon substrate typically have efficiencies of 10 to 20 percent, and, as a result, even small increases (e.g., of one to several percent) in efficiency represent large relative gains in being able to convert solar energy into useful electricity (e.g., an increase in efficiency of 1 to 2 percent represents a 5 to 20 percent or higher gain in efficiency for a cell design).

In many microelectronic fabrication processes, thick film conductors are widely used in the devices including silicon (Si) solar cells. For example, Si solar cells are presently fabricated with a contact formed by screen printing a metallic paste such as a mostly silver (Ag) paste upon an anti-reflective (AR) coating (e.g., $SiN_x$) previously applied to a substrate. For Si solar cells, a glass frit with a low melting point is an essential component of these metallic pastes because the fits provide a good adhesion of the metal (e.g., Ag) to the semiconductor substrate and also serve as a "fire through" agent or burn-through agent. The burn-through agent represents a significant volume fraction of the screen print material. "Fire through" is the name given to the process of establishing an electrical contact between the metal (e.g., Ag) and the Si substrate by etching through the AR coating, which is typically made up of a dielectric material, or through a native oxide, at elevated temperatures. Additionally, the glass fits act to reduce the temperatures required to perform the metal-to-Si alloying to form an electrical contact in the solar cell.

The addition of glass in the Ag pastes helps to facilitate an electrical contact between the Ag of the deposited paste and the Si substrate through an AR layer or coating (e.g., a thin layer of SiNx AR coating). The fire through process typically takes several seconds and is typically performed at temperatures greater than 700° C., whereas without the addition of frits much higher temperatures (e.g., 850 to 1000° C.) along with longer annealing times (e.g., 10 to 20 minutes versus seconds) are required. Higher processing temperatures and longer anneal times are undesirable because high temperatures are often detrimental to the overall properties of the fabricated solar cells. Higher temperatures and longer processing times also increase production costs associated with Si-based solar cells and photovoltaics.

It is desirable to improve the process of fabricating the solar cell contact. The use of screen printing using Ag paste can be problematic in some applications because it is a contact deposition process that may cause damage to fragile and/or brittle substrates or components such as many Si solar cell structures. Another concern with the present methods of applying a silver contact is the effectiveness and/or size of the connection or contact between the silver and silicon of the cell substrate. With the use of glass fits in the Ag-containing paste, the effective contact achieved with the burn through process is sometimes only 1 to 3 percent of the area of the printed contact pattern. With such small area of the contact in order to achieve reasonable contact resistance very low contact resistivity in the areas of the contact is required. This is accomplished by doping Si to the levels above $10^{19}$ $cm^3$ for the n-type emitter. High doping levels between the metal fingers of the front contact compromise blue response and reduce Voc of the cells. The compositions of the glass frits used in commercial pastes are typically kept proprietary but are known to generally contain a mixture of various oxides (e.g., PbO, $SiO_2$, $B_2O_3$, and the like). The glass for the glass frits is formed by refluxing and homogenizing the oxide constituents at high temperatures (e.g., above 1000° C.), and then grinding and milling of the glass produces glass frit powder that is provided in the commercial paste. After the burn through or contact formation process is completed, a significant amount of the glass material remains in the contact, which is undesirable as it is a dielectric material and increases the resistivity of the contact. To address these inefficiencies, printing is often performed with lines or contacts that are wider and thicker than would be needed if better contact efficiencies and higher conductivity through the contact layer could be achieved, and Si solar cell manufacturing requires greater amounts of silver. In addition, current technical limitations of screen printing limit line size to 70 to 150 μm, which is much wider than needed. If line widths could be lowered to 40 to 50 μm then the overall efficiency could be improved just by limiting shadowing losses. Large size (1-5 μm) of the frit particles prevents the use of Ag pastes containing frits with higher-resolution deposition and patterning techniques such as inkjet printing.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Briefly, a method of forming a contact is provided such as a contact for a solar cell that includes applying a burn through agent in the form of an ink or solution of a precursor to an oxide upon an antireflective coating of a silicon (Si) substrate or wafer. For example, the ink may include a precursor such as an organometallic complex to an oxide (or metal-oxide glass) such as $Bi_2O_3$, ZnO, or the like. The ink is applied by inkjet printing or other non-contact deposition methods in some embodiments and is then heated or otherwise processed to decompose the precursor to form a burn through (BT) layer or element directly on the AR layer. The method further includes depositing a metal contact upon the BT layer and then annealing the structure to cause the BT layer to fire through an AR coating and facilitate the diffusion of Ag towards Si and alloying of Ag with the Si of the cell substrate. The metal contact may, like the BT layer, be printed by inkjet or other non-contact deposition methods such as with an ink including an organometallic Ag complex in solvent or another liquid Ag precursor.

The use of an oxide precursor ink in conjunction with inkjet printing may provide a number of advantages as compared with screen-printed Ag paste with glass frits. For example it is conceivable that the direct contact between the Ag metal and Si occurs at the edges of the BT phase where all three components: the Ag, the BT material and the substrate are in direct contact with each other. In conventional silver pastes, where the frit is simply mixed in with the Ag particles, the shape and the area of the burn-through islands formed on the substrate upon firing cannot be directly controlled. Using the direct write techniques such as inkjet printing would allow shaping the BT layer as to maximize the area of the Ag/Si direct contact formation. Increasing the area of the Ag/Si contact would allow for lower doping level in the emitter improving the blue response of the cells. It is likely that better conductivity in the contact or fire through component as well as the body of the contact will be achieved (e.g., down to 4 to 7 milliohms-$cm^2$ contact resistivity, or lower, versus paste-based contacts that have 10 to 15 milliohms-$cm^2$ contact resistivity). Hence, a significant improvement in the power output can be achieved (e.g., up to 1 to several percent improvement) and/or a thinner or smaller volume of Ag may be used in the contact for the same or better functionality of the contact. This also facilitates the use of narrower lines allowing for a similar improvement in efficiency. In some cases, concurrent doping of the Si of the cell substrate is achieved during burn through or annealing (e.g., with doping materials or precursors to such dopants provided in the BT layer and/or in the ink used to apply the metallization for the contact) to provide the so-called self-doping contacts. The BT material and contact may be deposited using non-contact methods such as inkjet printing, spray deposition, and the like rather than a screen printing of Ag paste that involves mechanical pressure on the substrate. Further, the processing temperatures for precursor decomposition to Ag and/or a BT agent and/or for burn-through to occur are in some cases lower than previously required for fabricating a contact with Ag paste.

More particularly, a method is provided for fabricating a contact for a solar cell. The method includes providing a solar cell substrate such as a Si wafer with a surface that is covered or includes an antireflective (AR) coating. For example, the substrate may be positioned adjacent or proximate to an outlet of an inkjet printer or other deposition device. The method continues with forming a burn through (BT) layer on the AR coating by depositing a metal oxide precursor (e.g., using an inkjet or other non-contact printing method to print or apply a volume of liquid or solution containing the precursor). The method also includes forming a contact layer comprising silver over or on the BT layer, and then annealing is performed to mate or alloy the contact layer to the surface of the solar cell substrate through the AR coating. The method also includes forming the BT layer by heating the deposited MO precursor to a temperature of at least about 200° C. to form the metal oxide (e.g., PbO, ZnO, SnO, $In_2O_3$, $B_2O_3$, $Sb_2O_3$, and $Bi_2O_3$, etc.). The metal oxide precursor may be provided in a solution or ink (at room or ambient temperature) with the solution including a metal-organic precursor to a particular MO. The deposition of the metal oxide precursor of the BT layer may include non-contact printing such as inkjet printing of a volume of the solution or ink at ambient pressure upon the AR coating on the cell surface. The ink or solution may be printed in a pattern such as to correspond to later printed contact elements (e.g., fingers or lines of a contact) or in a predefined pattern of spaced apart islands. The metal oxide precursor may include dissolved chemical precursors of a metal oxide or may include a nanoparticle suspension of the metal oxide. In some cases, the metal oxide precursor is deposited in or as a liquid ink that includes silver precursors or silver nanoparticles.

In addition to the exemplary aspects and embodiments described above, further aspects and embodiments will become apparent by reference to the drawings and by study of the following descriptions. For example, while the description generally focuses on the burn through of an AR coating, the approach taught herein also works well for Si wafers without an AR coating. In such cases, the added oxide and/or other materials can accelerate contact formation and can dope under the contacts.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

FIG. 5 illustrates schematically a Si solar cell structure similar to the cells of FIGS. 3 and 4 but with a single Ag/Burn Through layer printed upon the AR coating of the cell, with the layer provided by an ink or liquid including a precursor to a metal oxide such as a metal complex, an organometallic reagent, or the like;

Figure 6A:
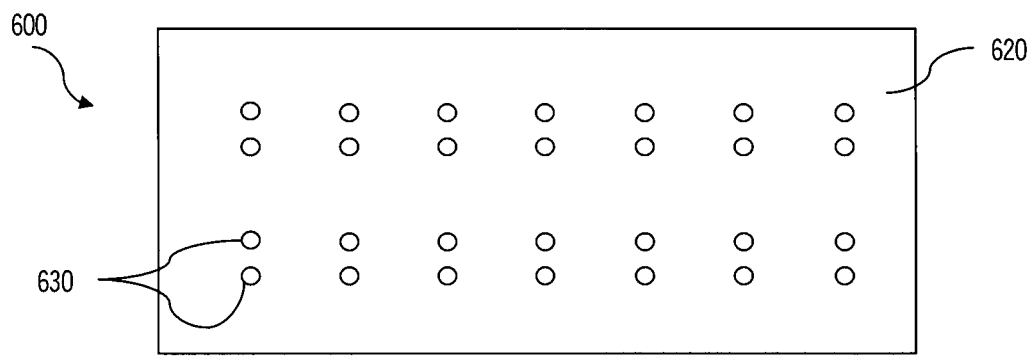
Figure 6B:
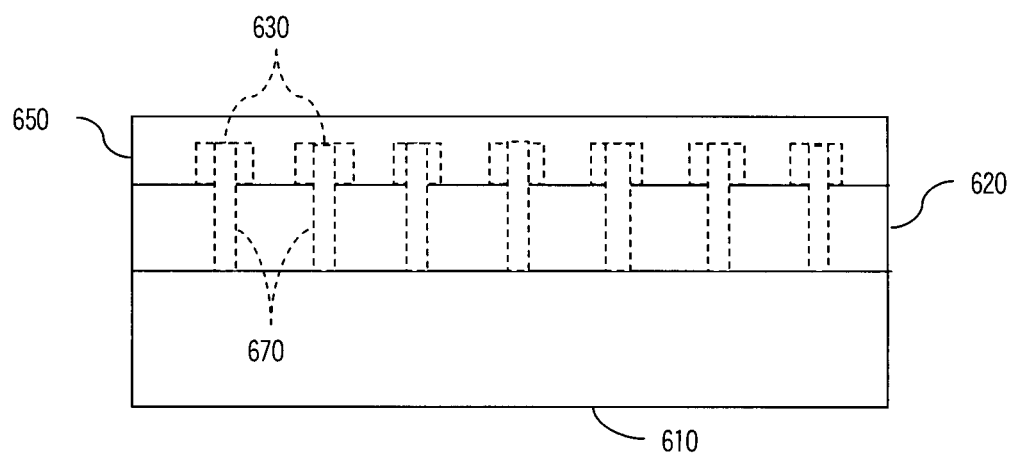
Figure 7:
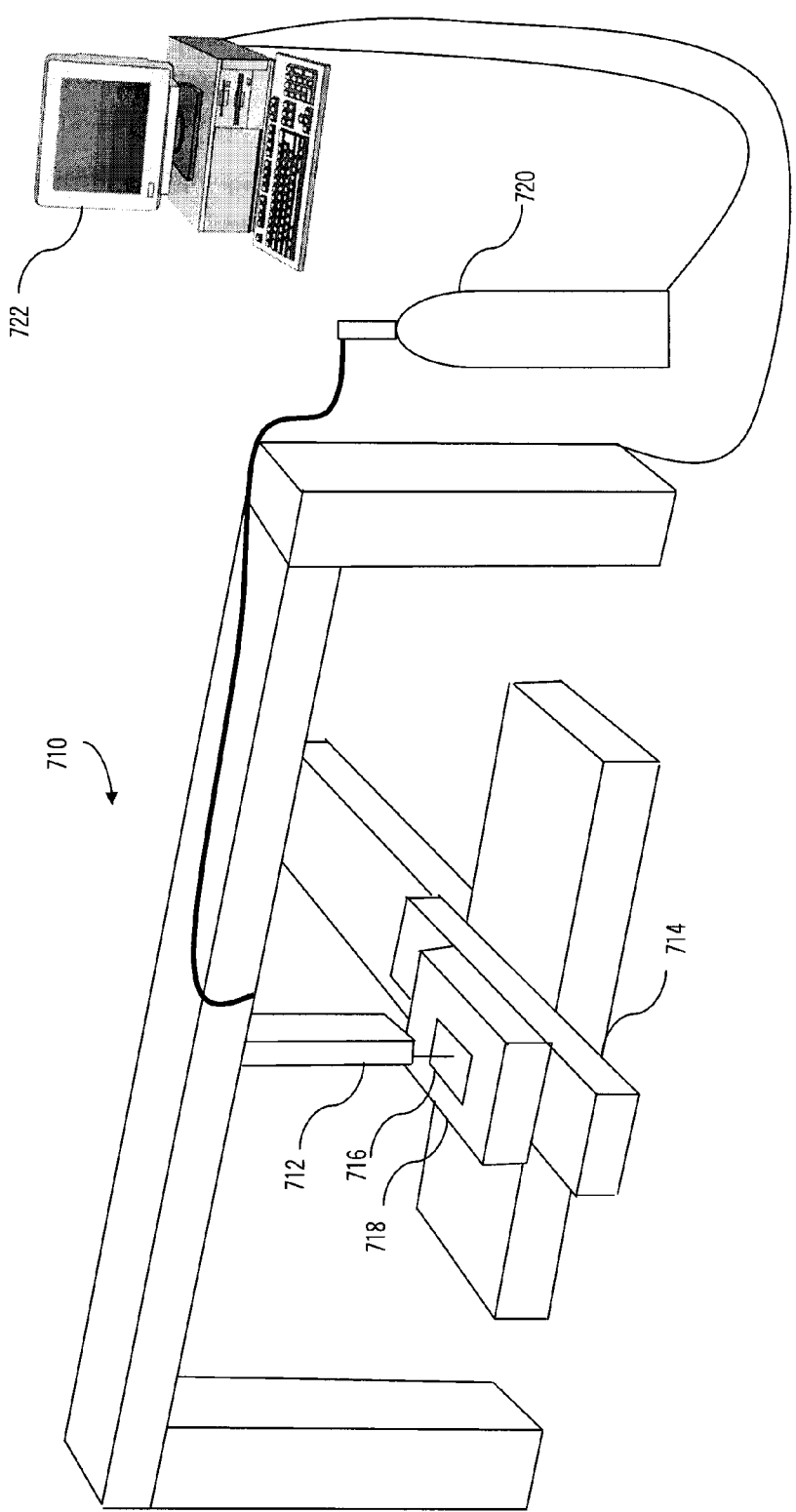
Figure 8:
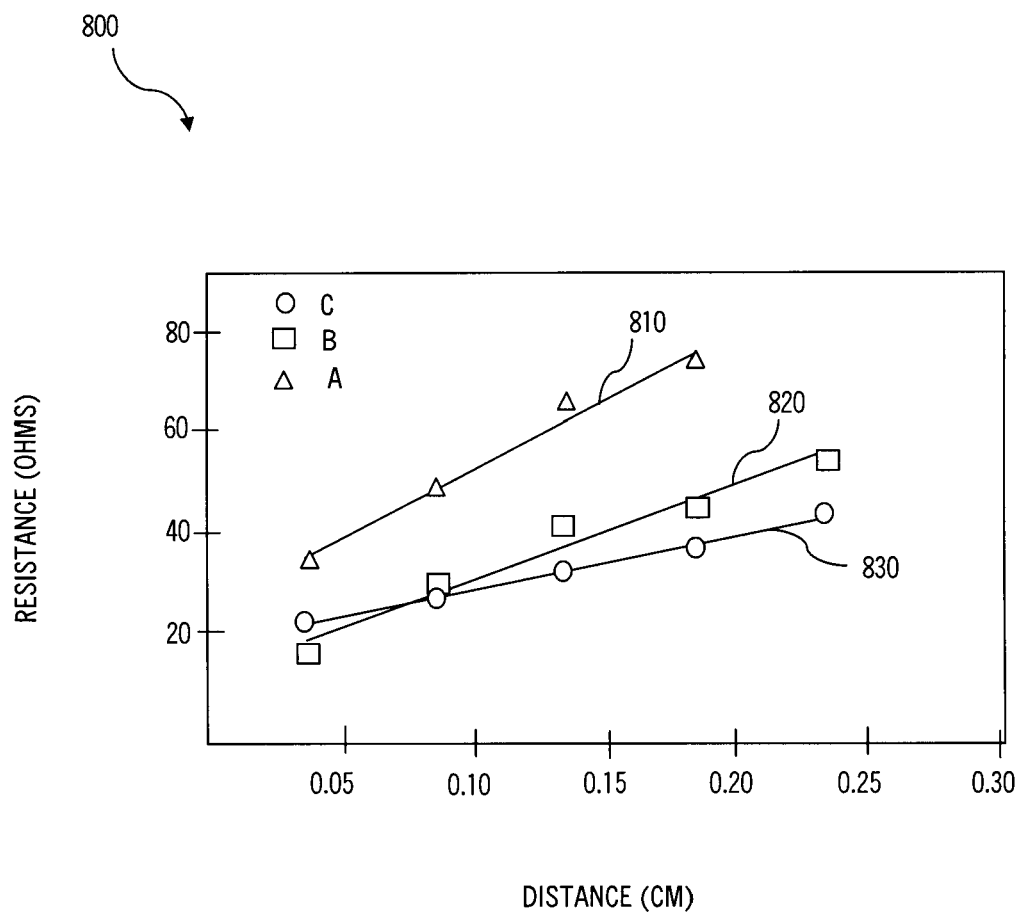

FIGS. 6A and 6B illustrate top and side views of a solar cell with the top view showing the cell structure after a pattern of BT islands has been printed and the side view showing the cell structure after an Ag contact layer has been applied and fire through performed to cause the Ag to alloy to the Si through the BT islands to provide electrical contact and connectivity between the Ag contact(s) and the Si substrate;

FIG. 7 is a block diagram of an exemplary deposition system that may be implemented for direct writing or printing of precursor inks (e.g., BT layers and Ag contact layers) onto Si wafers or solar cell substrates; and FIG. 8 is a graph of illustrating resistance values for various line spacings for three tested solar cell structures from which contact resistance can be extrapolated.

DESCRIPTION

Briefly, the following description provides methods for achieving enhanced electric connectivity between a metal contact layer (e.g., a deposited Ag layer) and a solar cell substrate. In some embodiments, the improved solar cell contacts are achieved by providing burn through agents in a layer that is deposited (e.g., printed) upon the antireflective (AR) material or coating prior to the application of the metallization for the contact (e.g., printing or other deposition of a quantity of Ag or other contact material). Annealing is then performed to allow the metal to move through the separately deposited burn through layer (or pattern such as a plurality of dots or islands of BT material) etching through (or firing through) an AR coating and alloy with the Si of the cell substrate. In this manner, the use of glass fIits can be eliminated and improved contacts can be produced at lower temperatures.

Figure 1:
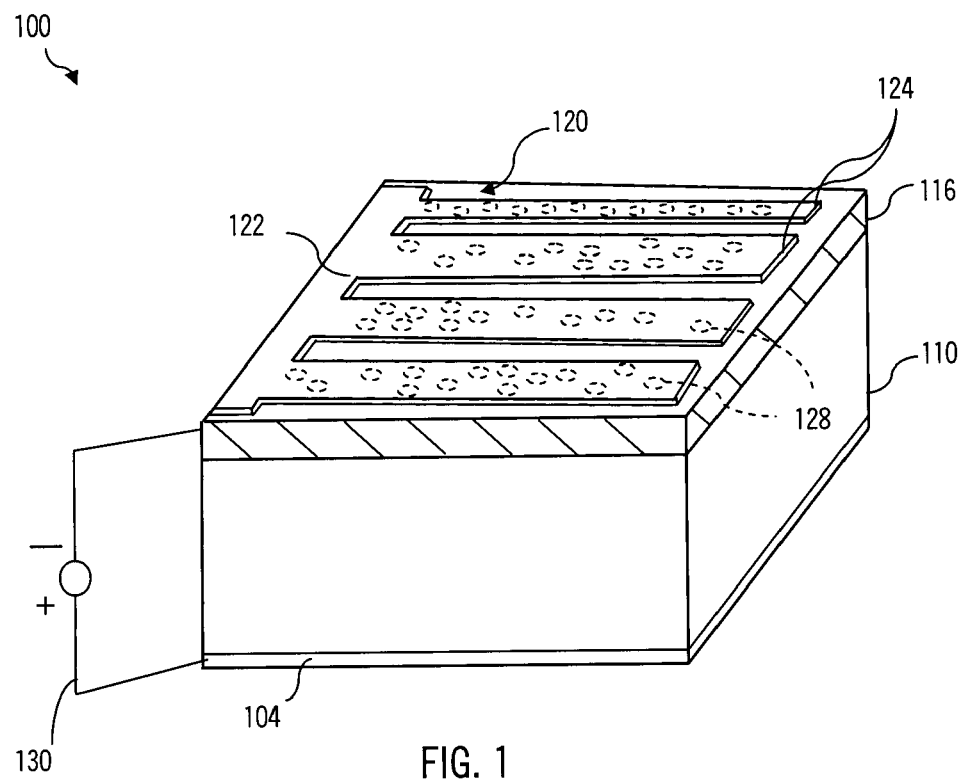
FIG. 1 is a perspective view of a solar cell of one embodiment with contacts provided using a burn through agent layer deposited or printed in a pattern of spaced apart islands.

The deposition methods described herein for providing burn through agents are well suited for use in fabrication of solar cells. FIG. 1 illustrates a solar cell 100 that may be formed using these enhanced deposition methods, and the cell 100 includes a rear metal contact 104 (such as a p contact provided as a layer or pattern of aluminum in a Si solar cell design). The cell 100 also includes a substrate 110 providing a p-semiconductor layer, a p-n junction, and an n-semiconductor layer (e.g., a Si wafer or substrate). An AR coating 116 is provided on the front of the cell 100 and may be formed of a $SiN_x$ or other dielectric material useful in solar cells for its antireflective properties. On the AR coating 116, a contact 120 is deposited that includes a bus bar 122 and contact lines/fingers 124 extending out from the bar 122. The bus bar 122 and contact fingers 124 may be a metallization of a variety of metals with some Si cell designs including a metallization of or including silver for contact 120. The contact fingers 124 are alloyed or contact the substrate 110 through the AR coating 116 via burn through layer 128 shown as islands, and the application of the contact bar and fingers 122, 124 and burn through layer 128 is described in detail below. The cell 100 further includes a consumer circuit 130 connecting the two contacts 104, 120. The burn through layer 128 may be provided as a separate layer from the contact 122, 124 (e.g., each may be printed separately) or in some cases, the burn through agent 128 may be provided concurrently with deposition (e.g., inkjet or other ink-based deposition methods) of the contact metal as a replacement for glass frits and without need for paste (although the contact 120 may be applied as a paste with screen printing in some embodiments).

In some embodiments, metal salt precursors are provided in the ink used to print the contact 120 to provide the burn through agent as a mixed-oxide glass. This provides an enhanced fire-through contact through the islands/layer 128 for solar cell 100 as burn-through is provided by the use of solution-based chemical precursors to oxides in the place of actual glass fits. In one embodiment, soluble chemical precursors (e.g., organometallic complexes and reagents) to various oxides are incorporated into a solution or ink (at room temperature in some cases) containing a particulate metal or metal-organic (MO) precursor. In the reaction (e.g., the annealing or burn through process), the oxide precursor and metal precursor decompose to form an analog of the conventional glass frit paste/system. This process occurs with no prior preparation to produce oxide and can be performed at relatively low temperatures such as in the range of below 200 to 500° C.

It also should be noted that substituting oxide fits with the dissolved organic and inorganic metal salts dry may provide the additional advantage of the salts, upon thermal decomposition, forming small nanosized oxide particles, which are more reactive than the microsized glass frit particles, therefore achieving etching of $Si_3N_4$ at lower temperatures and minimizing the presence of the insulating oxide phase (rather than 800 to 1000° C. as is case of paste with glass frits).

Figure 5:
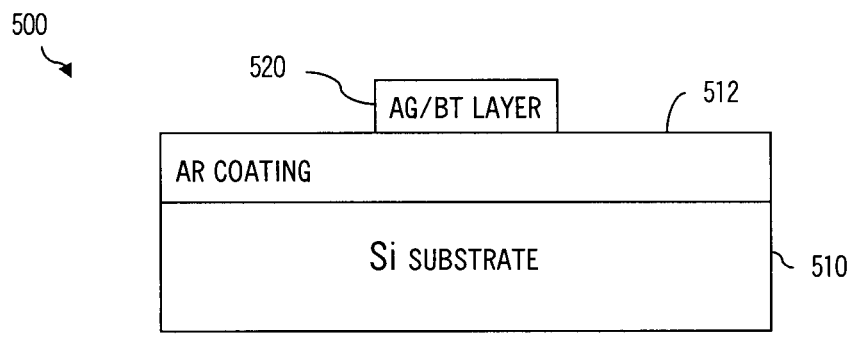

FIG. 5 illustrates schematically a Si solar cell structure 500 formed using an oxide precursor in Ag ink (or a solution with a precursor to Ag) prior to burn through or annealing processes. As shown, the cell structure 500 includes a Si substrate 510 with a diffused p/n junction upon which a layer of AR material 512 has been applied such as $SiN_x$ or the like. Upon the AR coating 512 a layer of ink or solution 520 with an organometallic Ag complex and a precursor to a burn through agent (such as an oxide chosen from PbO, ZnO, SnO, $In_2O_3$, $B_2O_3$, $Bi_2O_3$, and other oxides) is deposited. The ink 520 may be printed using inkjet or other printing methods in a layer or in a pattern (e.g., a bus bar with lines or fingers or other pattern useful for cell contacts). In one embodiment, the ink or solution 520 is printed using inkjet printing or other printing methods at room temperature and ambient pressure, and methods for printing or direct writing metallizations such as those with Ag and burn through agents (e.g., oxide precursors) may be those taught in U.S. Patent Publication No. 2008/0003364, which is incorporated herein by reference.

In addition to this lower temperature, another advantage of using liquid chemical precursors in the contact ink (or paste in some cases) is the versatility in the delivery/deposition methods and, consequently, the control over the physical properties of the deposited oxide layers. In thick film technology, metallic pastes are screen printed onto the substrate of a cell. Large glass particles (e.g., 2 to 25 µm) are mixed into the paste. During the firing process, molten frits flow down through the AR coating and wet the substrate. Due to the random size and distribution of the frit particles in the paste, wetting of the substrate and the thickness of the glass layer is not uniform underneath the metal contact, which may lead to increased contact resistance or at least unpredictable conductivity in a cell. At the same time, frits represent a significant volume fraction of the paste after annealing is completed (e.g., the dielectric material remains in the contact after cooling), and this leads to higher in-line resistances. On the contrary, solutions of chemical precursors to oxides can be applied through spin coating, inkjet printing, spray deposition, stamping, or other deposition methods in a thin active layer or a pattern of a uniform and controlled thickness (e.g., less than 1 micron such as 0.5 microns or much thinner layers). For example, submicron uniform layers of the oxides can be easily achieved using liquid precursors, while the large size of the frit particles prevents this possibility.

As explained below, this can be used to provide separate burn through layers/patterns deposited or printed between the AR coating and the metal contact layer (e.g., see FIGS. 2-4, 6A, and 6B and associated description). The ability to print a fire-through oxide layer immediately onto the surface of a Si wafer (with and without AR coating) instead of dispersing the particles of oxide throughout the paste provides several significant advantages. For example, the precursor reacts at the interface (between the deposited BT material and the metal contact layer) controlling interface properties directly while not adversely affecting conductivity of the bulk of the metallization. Also, for example, having oxide at the interface with the substrate (rather than dispersed as frits as in pastes) eliminates the need for the etchant to flow toward the substrate in the process to obtain a conductive path or contact. This may allow for much simpler formulations, reducing the amount of or even eliminating some typical oxide constituents that are included to control physical properties of the glass frits, such as softening temperature, and leaving only the functional "fire through" components of the glass. Reducing the amount of these "extra" dielectric phases may in turn improve bulk conductivity and reduce contact resistance.

Figure 3:
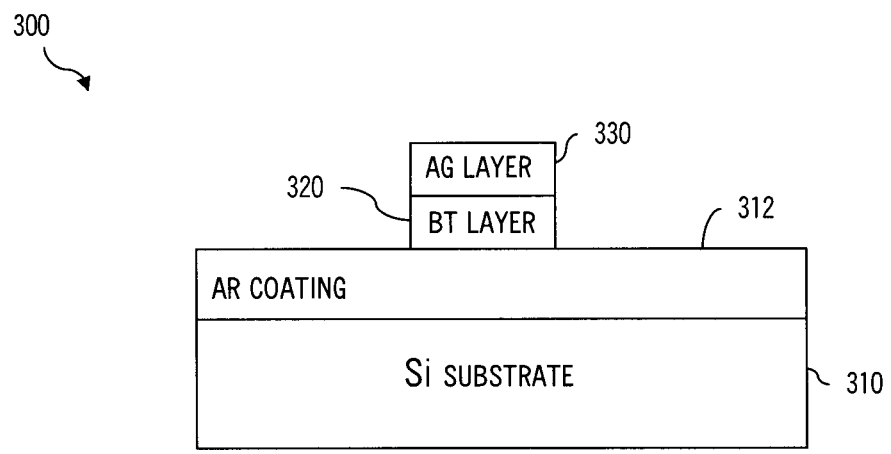
FIG. 3 illustrates schematically a Si solar cell structure with an Ag layer/contact provided over a separately deposited burn through layer formed using a liquid precursor to a metal oxide.

In one tested embodiment, a cell structure 300 was produced with a Si substrate 310, an AR coating 312 (e.g., $SiN_x$), a burn through layer 320, and a printed Ag layer or metal contact 330 upon the BT layer 320. In FIG. 3, the structure 300 is shown prior to fire/burn through or annealing processes are performed e.g., annealing at 650 to 800° C. Again, the Ag layer 330 and BT layer 320 may be printed using inkjet or other techniques at ambient temperature and pressure (e.g., as discussed further with reference to FIG. 7). In this embodiment of cell 300, the BT layer 320 is provided as a PbO layer that is inkjet printed with the "ink" being a Pb acetate in ethylene glycol precursor. In other devices/structures 300, it may be advantageous to extend the liquid precursor approach to the mixture of multiple metal oxides (such as those listed below and/or precursors or MO complexes of such oxides) in order to optimize the process of the contact formation and the final contact properties (e.g., to enhance conductivity, to allow annealing at a desired lower temperature range to protect the Si substrate 310, and so on).

Figure 2:
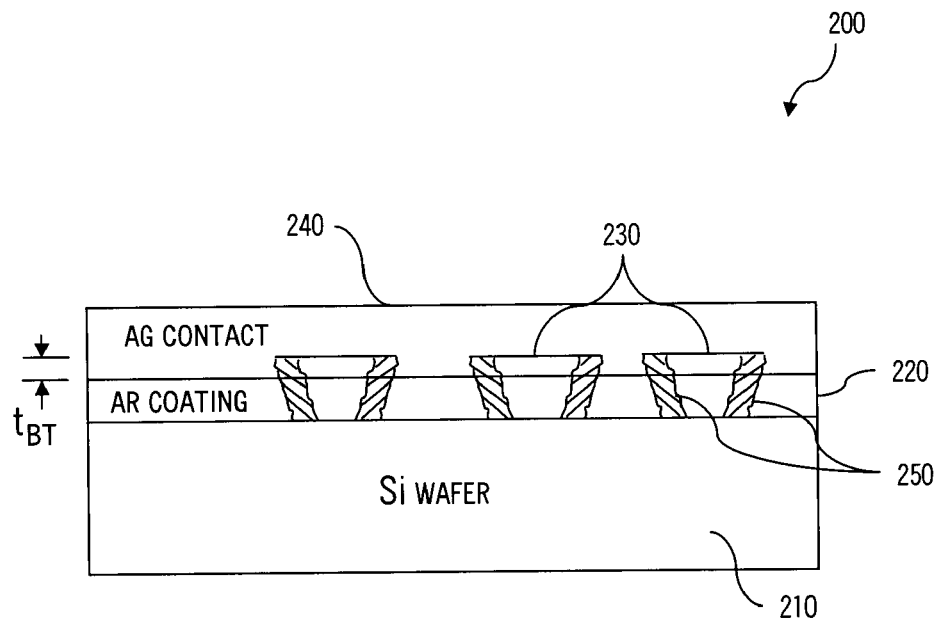
FIG. 2 illustrates schematically a cross section or side view of a portion of a Si solar cell after annealing to alloy a silver contact layer to the silicon via printed burn through element or islands.

Due to perceived and actual environmental hazards of using lead, the use of lead-containing materials in recent years is being phased out in the electronics industry creating a demand for suitable and more benign replacement materials. With this in mind, embodiments of the BT agents may include Pb-free metal oxides formed by decomposing and/or heating liquid precursors. For example, FIG. 2 illustrates a Si solar cell structure 200 (e.g., a portion of a cell that may be further processed to add a rear or additional contact and other components to produce a solar cell or solar array). The structure 200 includes a Si wafer 210 with an AR coating 220. A plurality of BT drops or islands 230 are deposited upon the AR coating 220 such as by inkjet printing a liquid precursor of a lead-free oxide. An Ag contact 240 is then applied (again, through inkjet printing or other deposition methods) over the BT islands 230. Then, annealing is performed to allow metal contacts/connections 250 to be formed through the AR coating 220 to the Si wafer 210. In other embodiments, the BT material 230 may be applied as a layer or other pattern other than island/drops of oxide material.

In this manner, the use of Pb-free metal oxides from liquid precursors may be used for burn through Ag contact 250 to the Si solar cell substrate 210. The particular metal oxide provided by the BT ink or liquid precursor may be varied to produce a cell contact in structure 200. For example, the BT material or islands (or layer in other embodiments) 230 may include ZnO, SnO, $In_2O_3$, $B_2O_3$, AgO, $Sb_2O_3$, and $Bi_2O_3$, or other oxides. Additionally, various mixtures of these oxides may be used as the BT material 230. In some embodiments, these oxides were deposited as layers of BT material with a thickness, $t_{BT}$, (e.g., less than 1 micron with some embodiments using thicknesses of 0.5 microns and less), and the BT layer or elements 230 were provided by depositing (e.g., inkjet printing or the like) a volume of liquid chemical precursor(s) and, in some cases, the ink or precursor solution included particle suspensions (e.g., Ag nanoparticles (i.e., 100 nm or smaller particles) or the like to provide a desired property such as increase conductivity or increase contact area). The BT layer/components 230 are an intermediate layer or are sandwiched between the Ag layer or metallization 240 and the AR coating 220 (e.g., $SiN_x$ or the like) on the Si wafer 210. In testing, annealing of the deposited oxides was performed at temperatures in the 600 to 800° C. range for about 1 minute, and, after annealing, the oxides of the BT agent layer (such as layer 230 of FIG. 2) were found to provide enhanced contact formation between the Ag contact layer 240 and the Si of wafer 210. In some tests, the contacts were shown to have better conductivity with the contact resistivity being in the range of 4 to 7 milliohms-$cm^2$. This represents a significant improvement of conventional contacts formed using Ag paste with glass frits that may have contact resistivity of 10 to 15 milliohms-$cm^2$. Hence, it is anticipated that improvement in power output of a solar cell device (such as structure 200) may be improved one to several percent by implementing the shown BT structures/layers.

Figure 4:
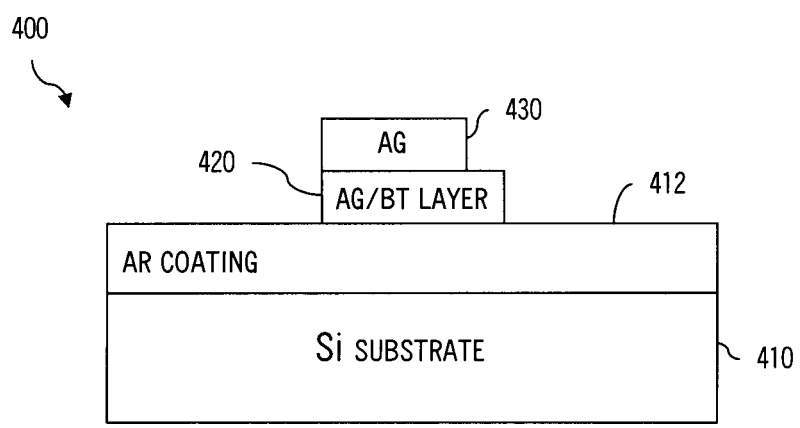
FIG. 4 illustrates schematically a Si solar cell structure similar to the cell of FIG. 3 with an Ag layer/contact provided over a separately deposited burn through layer formed using a liquid precursor to a metal oxide further including Ag (e.g., Ag nanoparticles, an organometallic precursor to Ag, or the like)

FIG. 4 illustrates another embodiment of a cell structure 400 that includes a Si substrate 410 with an AR coating 412. A contact 430 is provided with a printed or deposited Ag layer over the coating 412. To provide electrical connectivity, a BT layer 420 is deposited as a separate layer between the AR coating 412 and the Ag contact layer 430. In this embodiment 400, Ag precursor (e.g., an MO Ag complex or the like) is admixed to the metal oxide precursor system of the ink or solution used to print layer 420. The Ag is provided in the BT layer 420 to enhance contact formation speed and reduce contact resistance.

In other embodiments of cell 400, the BT layer 420 is formed with the use of combined metal oxide/metal liquid precursors where the precursors to metal (such as, but not limited to, Ag) may be in the form of a dissolved chemical compound or nano-particulate suspension. An example of such an embodiment is a mixture of an Ag metal-organic precursor and bismuth nitrate (5 to 10 atomic percent based on Ag) dissolved in ethylene glycol. Inkjet printing of this ink on a $SiN_x$-coated Si p/n junction followed by a rapid thermal processing cycle designed to reproduce the temperature profile of the typical belt furnace used in the manufacture of solar cells (e.g., 30 second ramp up to 750° C. followed by immediate cooling) resulted in formation of a good contact with a contact resistance of less than 0.007 ohm-$cm^2$. Including individual metallic components such as Ag, Sn, Bi, Zn, other metals, or alloys of Ag with Sn, Bi, Zn, or other metals in the ink of a metal oxide used to deposit layer 420 (with Ag shown in FIG. 4 as an example not as a limitation to the additives to the BT oxide) may produce a better efficiency of contact formation than currently provided by oxide fits.

In the case of Pb-containing frits, the contact formation between Ag and Si through $Si_3N_4$ (or $SiN_x$) coating has six important stages. These states include: (1) chemical etching of $Si_3N_4$ ($6PbO+Si_3N_4=3SiO_2+6Pb+2N_2$); (2) chemical etching of silicon ($2PbO+Si=SiO_2+2Pb$); (3) alloying of molten Pb with Ag; (4) transport of the Pb—Ag alloy through the glass; (5) Pb—Ag alloying with Si; and (6) separation of elements upon cooling (e.g., growing Ag islands or the like on Si). It is desirable to identify and provide replacement candidates for Pb in all 6 stages of the contact formation such as an oxide described herein. For example, in the metal oxide/metal system described herein, the etching and alloying functions are divided between the metal oxide and the metal constituents. For example, in one representative system (i.e., $B_2O_3$ from liquid chemical precursor+Bi—Ag alloyed nanoparticles), $B_2O_3$ provides the $Si_3N_4$/Si etching function while the alloyed Bi—Ag particles are readily available to alloy with the Si wafer through the AR coating.

More generally, the proposed liquid inks for use as burn through agents may include the following constituents (or combinations/alloys thereof): dissolved chemical precursors of metal oxides (e.g., ZnO, SnO, $In_2O_3$, $B_2O_3$, $Sb_2O_3$, $Bi_2O_3$, and the like); nanoparticle suspensions of the metal oxides (e.g., suspensions of particles less than about 100 nm in size); metallic particles of pure metals such as Zn, Sn, In, Sb, Bi, and the like and/or their alloys with Ag (or another metal in the contact); chemical precursors to Ag or nanoparticles of Ag; binders; solvents; and surfactants. The burn through agent may be printed as a separate layer as shown in FIGS. 3 and 4 in immediate contact with an AR coating such as $SiN_x$, while the bulk of the Ag layer or metallic contact is printed on top of the burn through layer.

The burn through layer may be continuous (a layer or pattern similar to that used for the contact, for example) or in a pattern of discontinuous dots or islands. For example, FIGS. 6A and 6B illustrates a solar cell structure 600 in which an AR coating 620 on a solar cell substrate 610 is printed with a pattern of islands or drops 630 of ink providing BT material. FIG. 6B shows the cell structure 600 after the contact 650 (e.g., a layer of Ag or the like) has been deposited and/or formed upon the BT islands 630. Further, the cell structure 600 of FIG. 6B shows results of an annealing or fire through process in which contacts 670 are formed as metal such as Ag diffuses through the BT islands 630 to contact and alloy with the Si of the substrate or wafer 610 after the AR coating 620 is etched away by the BT layer. In some cases, it is more likely that the burn through contacts 670 would form at the edges or interfaces between the Ag layer 650 and the periphery of the BT islands 630 and then extend through the AR coating 620 to the Si substrate 610. Hence, use of an island or discontinuous pattern for BT material 630 may be preferable because geometric principles indicate that the surface area available for interfacing with the Ag on a volumetric basis of BT material is significantly increased when compared with a continuous layer.

In addition, it is useful to emphasize that certain organic and inorganic Ag compounds are capable of etching through $SiN_x$ and establishing contact with Si without the addition of foreign oxides. Low contact resistances were achieved by Rapid Thermal Processing (RTP) of silver trifluoroacetate and silver nitrate alone. It is anticipated that use of other silver salts for the BT layer may lead to similar results. The inventors' understanding is that the etching process in this case is via the reaction of an intermediate product of silver salt decomposition ($Ag_2O$) with $SiN_x$ and Si. In addition, some silver salts are capable of etching through $SiN_x$ via the reaction of the counter ion (such as phosphate, trifluoroacetate, nitrate, and the like) with $SiN_x$. Other metal salts containing these counter ions will also etch through $SiN_x$. For example, $SiN_x$ was etched by the inventors after RTP by including $(NaPO_3)_6$ in a Ag metal ink. In this case, $(NaPO_3)_6$ not only etched through the $SiN_x$ dielectric but also brought about additional useful doping of the underlying Si substrate, thus enabling printed self-doping contacts.

While the printing of the BT layers and the Ag or other metal contact layers may be performed by any number of deposition methods, some embodiments utilize non-contact printing or spray deposition techniques. For example, the printing may be performed with an inkjet printer or similar device with the ink or solution utilized for the BT material and metal contact being of a low enough viscosity to allow printing or direct writing on the solar cell or other substrate. In some embodiments, the methods for printing metal inks taught in U.S. Patent Publication No. 2008/0003364, which is incorporated herein by reference, are utilized to deposited the BT ink and form the BT layers (e.g., by decomposing a precursor and then cooling) as well as the Ag layer for the contact on the BT material.

FIG. 7 is a block diagram illustrating an exemplary printing system 710 that may be implemented for inkjet printing of metal inks for a contact as well as BT solutions/inks on various substrates such as on Si solar cell wafers. The system 710 includes an inkjet 712 and a translation stage 714 for positioning a substrate 716 (e.g., a Si wafer with an AR coating) in the X and Y positions and adjacent the inkjet 712. A heating element 718 is provided on the translation stage 714 directly adjacent the substrate 716 to heat the substrate (e.g., 100 to 250° C.) to dry and decompose the precursors for the BT material and the Ag of the contact during printing of these inks. The fire through and contacting processes are accomplished in a subsequent anneal at (or in the range of about) 600 to 850° C. One or more optional gas supplies illustrated by gas cylinder 720 and attached supply lines may also be provided for controlling atmospheric conditions for printing the metal inks and the oxide precursor liquid/ink on the substrate 716. For example, it may be desirable to provide an inert atmosphere with argon or nitrogen from container 720. System 710 may also include a controller 722 (e.g., a computer system running positioning software or algorithms and/or printing and/or ink discharge control routines) to control various process parameters of the printing performed by system 710 such as operation of the translation stage 714 to position the substrate 716 relative to the outlet/orifice of the inkjet 712 (e.g., to establish a pattern of islands or a contact pattern), application rate of the inks by the inkjet 712 onto the substrate 716, increasing/decreasing temperature of substrate 716 by operation of heater 718 (e.g., to decompose the precursors to provide the Ag for a contact and/or to provide the desired oxide and/or to provide the annealing temperatures (or these may be provided at a later manufacturing stage), and/or application of one or more gases from the gas supply or supplies 720.

FIG. 8 illustrates a graph 800 of resistance versus line spacing for three manufactured solar cells 810, 820, 830 using burn through layers as described herein. The graph 800 shows the resistance between printed and burned through lines for various line spacing. From the values provided by lines 810, 820, 830, the contact resistance can be extrapolated for each of these three test structures, with the differences between the contact resistances being due to variations in process conditions.

It may also be noted that substituting for oxide frits with dry or dissolved organic and inorganic metal salts provides the additional advantage that the salts, upon thermal decomposition, form small nanosized oxide particles. These small oxide particles are much more reactive than micron-sized glass frit particles. As a result, the use of oxide precursors instead of glass fits allows etching of $SiN_x$ at lower temperatures and minimizes the presence of the insulating oxide phase in the resulting Ag contact of a solar cell or other electronic device.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope. The use of the ink allows printing of the BT layer/material as well as (in some cases) the Ag or other metal contact such as with inkjet printing, spray deposition, spin coating, stamping, and so on, which allows the BT layer/material to be provided in nearly any predefined pattern and on the same surface or adjacent other components (e.g., in the form of interdigitated contacts matching or similar to the Ag contact pattern). The description stresses applications that include forming a contact on a solar cell, but there are many other applications in which the deposition of Ag and forming a contact using burn through may be utilized and the receiving substrate for the BT layer and corresponding contact layer may be nearly any material such as plastic, glass, ceramic, metal, and so on. Also, as noted earlier, the basic approach of metal oxide or metal organic/dopant with metal may work well with a Si solar cell without an AR coating. As with the glass frits, the oxide layer or pattern from inorganic or organic metal salts as disclosed above may be used not as a burn-through agent but solely for mechanical bonding purposes, such as for bonding a metal contact to a substrate.

In one proposed embodiment, an inkjet printer is utilized for depositing the Ag precursor ink as it provides a desirable alternative to vacuum deposition, screen printing, and electroplating, with a wide variety of commercial printers being useful for depositing the Ag precursor ink. An advantage of using inkjet printing is that it is an atmospheric process capable of high resolution (e.g., features as small as 5 µm have been produced using an inkjet printer), and it is a non-contact, potentially 3D deposition process that makes it ideally suited to processing thin and fragile substrates such as solar cell substrates. In one application of a more specific printer (but not as a limitation against using more commercial or other not listed printers), an inkjet printer with a stationary drop-on-demand piezoelectric inkjet head from Microfab Technologies with a 50-micron orifice was utilized to print an Ag pattern or metallization on a substrate. The substrate temperature was increased to a printing temperature in the range of 150 to 200 C. via a resistive substrate heater plate positioned on an X-Y stage (substrate platform) provided under the inkjet orifice/outlet, with the X-Y positioning accurately selectable (e.g., the substrate was moved to pattern the silver with positioning to the 1 µm). In an exemplary embodiment, the metal inks are inkjet printed on a substrate in an inert environment (e.g., nitrogen, argon, or other oxygen-free atmosphere), including heating the substrate to about 180° C. (a substrate surface temperature in the range of about 140 to about 300° C.) and then applying the metal ink through the inkjet orifice/outlet using a drop generation rate such as about 50 Hz (e.g., in the range of 25-100 Hz or the like). This embodiment results in a deposition rate of about 1 µm per pass. Thicker deposits or metallizations may be obtained by inkjet printing multiple layers. According to conductivity testing, the contact formation process can be better controlled and also results in conductor lines having higher conductivity than typically achieved with vacuum and other deposition techniques.

The ink used to print the Ag contact or to print the BT layer/elements may include components, such as dispersants, binders, and/or surfactants for enhancing deposition, resolution, and/or adhesion of the metal inks to the substrate. For example, the surface properties of the ink may be adjusted for higher printing resolution by adding surfactants such as alkyl sulfonate, alkyl phosphate and phosphonate, alkyl amine and ammonium, and the like. In addition, one or more process parameters may be adjusted for the particular metal ink being used to optimize the inkjet printing process and/or properties of the printed features. For example, the substrate temperature, gas flow rate, and/or application rate of the metal inks may be adjusted to optimize deposition rate of the metal ink, purity/phase of the deposited metal, and/or adhesion to the substrate. Or, for example, the substrate temperature, gas flow rate, and/or application rate of the metal inks may be adjusted to optimize resolution, quality, thickness, conductivity and other electrical properties of the printed features.

The metal inks may be used for coating a substrate with metal (e.g., by spraying, dipping, and/or spinning techniques) and/or for producing metal features on a substrate (e.g., as lines, grids, or patterns) by inkjet printing or other direct-write deposition techniques. In addition, the metal inks may be used in a wide variety of different applications in addition to the shown solar cells. It is readily appreciated that applications of this technology may include, but are not limited to, printed circuit boards (PCBs), touch-screen display devices, organic light emitting diodes (OLEDs), cell phone displays, other photovoltaic devices, catalysts, decorative coatings, structural materials, optical devices, flexible electronics, and other electronic and micro-electronic devices.

Although the materials used in exemplary processes and embodiments have been provided above, it may be useful to provide a summary or further discussion at this point of $Si_3N_4$ burn-through materials. A set of exemplary criteria for metal oxide materials were developed that are thought to be necessary, or at least useful, for burn-through of $Si_3N_4$ and ohmic contact formation to Si. First, the metal oxide (MO) should react with $Si_3N_4$ and be reduced to the metal (M) in the reaction. Second, the metal M should have a melting point less than about 750° C. (e.g., to support processing temperature considerations). Third, the metal M should form alloys with both Ag and Si in the temperature range of interest (600-850° C. and the lower the temperature in this range, the better). It is also helpful (but not essential) that metal silicates formed as co-products in the etching reaction also be liquid in the same temperature range.

Oxides of the following metals fit these criteria: Zn, Cd, Hg, Ga, In, Tl, Sn, Pb, Sb, and Bi. Because of environmental and toxicity considerations, Cd, Hg, Tl and Pb are less desirable than the others but may be used in some applications. The oxides of interest are more typically, therefore: $ZnO$, $Ga_2O_3$, $In_2O_3$, $SnO$, $PbO$, $Sb_2O_3$ and $Bi_2O_3$. Although boron (B) does not melt or alloy with Si, $B_2O_3$ does etch $Si_3N_4$ and shows a synergistic effect when mixed with the other oxides that results in lower processing temperatures for both burn through and contact formation steps.

Materials useful as precursors to these exemplary oxides include: Zn, zinc acetate, zinc acetylacetonate, zinc tert-butoxide, zinc carboxylates, zinc hydroxide, zinc nitrate, zinc trifluoroacetate; Ga, gallium acetylacetonate, gallium isopropoxide, and gallium nitrate; In, indium acetate, indium acetylacetonate, indium isopropoxide, indium nitrate, and indium trifluoroacetate; Sn, tin (II) acetate, tin (II) acetylacetonate, tin (II) ethoxide, tin (II) methoxide and tin (II) stearate; Pb, lead (II) acetate, lead (II) acetylacetonate, lead (II) nitrate, lead (II) carboxylates; Sb, antimony (III) acetate, antimony (III) butoxide, antimony (III) ethyleneglycoxide, antimony (III) alkoxides in general; Bi, bismuth acetate, bismuth carboxylates in general, bismuth nitrate; B, boric acid, trialkyl borate esters (e.g., tributyl borate, triphenyl borate), bis(pinacolato)diboron.

The invention claimed is:
1. A method of fabricating an electric contact for a solar cell, comprising:
   providing a solar cell substrate with a surface including an antireflective coating;

forming a burn through layer on the antireflective coating including depositing a metal oxide precursor;

after the forming of the burn through layer, forming a contact layer comprising silver over the burn through layer, wherein the contact layer is free of glass frits;

etching through the antireflective coating by decomposing the metal oxide precursor; and annealing the contact layer to the surface of the solar cell substrate through a metal oxide formed from the decomposing of the metal oxide precursor, wherein the metal oxide precursor comprises a solution at ambient temperature including a metal-organic precursor to the metal oxide.

2. The method of claim 1, wherein the forming of the burn through layer further comprises heating the deposited metal oxide precursor to a temperature of at least about 200° C. and less than about 500° C. to form the metal oxide.

3. The method of claim 2, wherein the metal oxide comprises at least one of the metal oxides selected from the group consisting of PbO, ZnO, SnO, $Ga_2O_3$, $In_2O_3$, $B_2O_3$, $Sb_2O_3$, and $Bi_2O_3$.

4. The method of claim 1, wherein the depositing of the metal oxide precursor comprises non-contact printing of a volume of the solution at ambient pressure upon the surface over the antireflective coating.

5. The method of claim 4, wherein the printing comprises using an inkjet printer and applying the volume of the solution to the surface as a pattern of spaced apart islands.

6. A method of fabricating an electric contact for a solar cell, comprising:

providing a solar cell substrate with a surface including an antireflective coating;

forming a burn through layer on the antireflective coating including depositing a metal oxide precursor;

after the forming of the burn through layer, forming a contact layer comprising silver and being free of a burn-through agent over the burn through layer;

etching through the antireflective coating by decomposing the metal oxide precursor; and annealing the contact layer to the surface of the solar cell substrate through a metal oxide formed from the decomposing of the metal oxide precursor, wherein the metal oxide precursor comprises dissolved chemical precursors of the metal oxide.

7. The method of claim 1, wherein the metal oxide precursor comprises a nanoparticle suspension of the metal oxide.

8. The method of claim 1, wherein metal oxide precursor is deposited in a liquid ink that includes silver precursors or silver nanoparticles.

9. The method of claim 1, wherein forming the burn through layer on the antireflective coating further comprises depositing the metal oxide precursor onto the antireflective coating in a pattern comprising a plurality of islands; and wherein annealing the contact layer to the surface of the solar cell substrate further comprises diffusing metals of the contact layer through the plurality of islands to alloy with the surface of the solar cell substrate.

10. A method of fabricating an electric contact for a solar cell, comprising:

providing a solar cell substrate with a surface including an antireflective coating;

forming a burn through layer on the antireflective coating including depositing a metal oxide precursor;

forming a contact layer comprising silver over the burn through layer;

etching through the antireflective coating by decomposing the metal oxide precursor; and annealing the contact layer to the surface of the solar cell substrate through a metal oxide formed from the decomposing of the metal oxide precursor, wherein metal oxide precursor is deposited in a liquid ink that includes silver precursors or silver nanoparticles.

11. The method of claim 10, wherein forming the burn through layer on the antireflective coating further comprises depositing the metal oxide precursor onto the antireflective coating in a pattern comprising a plurality of islands; and wherein annealing the contact layer to the surface of the solar cell substrate further comprises diffusing metals of the contact layer through the plurality of islands to alloy with the surface of the solar cell substrate.

12. The method of claim 6, wherein forming the burn through layer on the antireflective coating further comprises depositing the metal oxide precursor onto the antireflective coating in a pattern comprising a plurality of islands; and wherein annealing the contact layer to the surface of the solar cell substrate further comprises diffusing metals of the contact layer through the plurality of islands to alloy with the surface of the solar cell substrate.

* * * * *